(12) United States Patent
Kagan et al.

(10) Patent No.: US 7,609,719 B2
(45) Date of Patent: Oct. 27, 2009

(54) SYSTEM AND METHOD FOR SIMULTANEOUS COMMUNICATION ON MODBUS AND DNP 3.0 OVER ETHERNET FOR ELECTRONIC POWER METER

(75) Inventors: Erran Kagan, Great Neck, NY (US); Fredrick Slota, Lake Ronkonkoma, NY (US); Wei Wang, Bronx, NY (US); Joseph Spanier, Brooklyn, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 418 days.

(21) Appl. No.: 11/087,438

(22) Filed: Mar. 23, 2005

(65) Prior Publication Data

US 2006/0077999 A1    Apr. 13, 2006

Related U.S. Application Data

(63) Continuation-in-part of application No. 10/969,592, filed on Oct. 20, 2004.

(60) Provisional application No. 60/617,689, filed on Oct. 12, 2004.

(51) Int. Cl.
*H04J 3/16* (2006.01)
(52) U.S. Cl. ................................ 370/466; 370/469
(58) Field of Classification Search ......... 370/465–467, 370/395.5, 395.51–395.54; 702/57, 60, 61, 702/64
See application file for complete search history.

(56) References Cited

U.S. PATENT DOCUMENTS

| | | | |
|---|---|---|---|
| 5,650,936 | A | 7/1997 | Loucks et al. |
| 5,736,847 | A | 4/1998 | Van Doorn et al. |
| 5,796,742 | A * | 8/1998 | Klotzbach et al. ........... 370/466 |
| 5,828,576 | A | 10/1998 | Loucks et al. |
| 5,995,911 | A | 11/1999 | Hart |
| 6,000,034 | A | 12/1999 | Lightbody et al. |
| D427,533 | S | 7/2000 | Cowan et al. |
| D429,655 | S | 8/2000 | Cowan et al. |
| D435,471 | S | 12/2000 | Simbeck et al. |
| 6,185,508 | B1 | 2/2001 | Van Doorn et al. |
| 6,186,842 | B1 | 2/2001 | Hirschbold et al. |
| D439,535 | S | 3/2001 | Cowan et al. |
| 6,236,949 | B1 | 5/2001 | Hart |
| D443,541 | S | 6/2001 | Hancock et al. |
| 6,397,155 | B1 | 5/2002 | Przydatek et al. |

(Continued)

OTHER PUBLICATIONS

"An Extendable Data Engine based on OPC Specification"—Xu Hong; Wang Jianhua; Computer Standards & Interfaces Dec. 5, 2003 Retrieved Nov. 2, 2007: http://www.sciencedirect.com.*

*Primary Examiner*—Seema S Rao
*Assistant Examiner*—Xavier Szewai Wong
(74) *Attorney, Agent, or Firm*—Gerald E. Hespos; Anthony J. Casella; Michael J. Porco

(57) ABSTRACT

A system and method is provided for simultaneous communications on Modbus and DNP 3.0 over Ethernet for an electronic power meter. The system incorporates one or more protocol wrappers to provide compatibility with both Modbus and DNP based applications. The system removes the appropriate wrappers and routes the incoming data packet to its destination. Additionally, the system also wraps outgoing response packets with the appropriate protocol wrapper based on the related data packet wrappers.

10 Claims, 4 Drawing Sheets

U.S. PATENT DOCUMENTS

| | | |
|---|---|---|
| D458,863 S | 6/2002 | Harding et al. |
| D459,259 S | 6/2002 | Harding et al. |
| 6,493,644 B1 | 12/2002 | Jonker et al. |
| 6,563,697 B1 | 5/2003 | Simbeck et al. |
| 6,567,404 B1 * | 5/2003 | Wilford ................... 370/389 |
| 6,578,084 B1 * | 6/2003 | Moberg et al. ............. 709/236 |
| 6,611,773 B2 | 8/2003 | Przydatek et al. |
| 6,611,922 B2 | 8/2003 | Ozcetin et al. |
| 6,615,147 B1 | 9/2003 | Jonker et al. |
| 6,636,030 B1 | 10/2003 | Rose et al. |
| 6,671,635 B1 | 12/2003 | Forth et al. |
| 6,671,654 B1 | 12/2003 | Forth et al. |
| 6,687,627 B1 | 2/2004 | Gunn et al. |
| 6,694,270 B2 | 2/2004 | Hart |
| 6,735,535 B1 | 5/2004 | Kagan et al. |
| 6,737,855 B2 | 5/2004 | Huber et al. |
| 6,745,138 B2 | 6/2004 | Przydatek et al. |
| 6,751,562 B1 | 6/2004 | Blackett et al. |
| 6,751,563 B2 * | 6/2004 | Spanier et al. ............. 702/61 |
| 6,792,337 B2 | 9/2004 | Blackett et al. |
| 6,792,364 B2 | 9/2004 | Jonker et al. |
| 6,798,190 B2 | 9/2004 | Harding et al. |
| 6,798,191 B1 | 9/2004 | Macfarlane et al. |
| 6,813,571 B2 | 11/2004 | Lightbody et al. |
| 6,825,776 B2 | 11/2004 | Lightbody et al. |
| 6,853,978 B2 | 2/2005 | Forth et al. |
| 6,871,150 B2 | 3/2005 | Huber et al. |
| D505,087 S | 5/2005 | Ricci et al. |
| 6,894,979 B1 * | 5/2005 | Lee ........................... 370/241 |
| 6,944,555 B2 | 9/2005 | Blackett et al. |
| 6,957,158 B1 | 10/2005 | Hancock et al. |
| 6,961,641 B1 | 11/2005 | Forth et al. |
| 6,983,211 B2 | 1/2006 | Macfarlene et al. |
| 6,988,025 B2 | 1/2006 | Ransom et al. |
| 6,988,182 B2 | 1/2006 | Teachman et al. |
| 6,990,121 B1 * | 1/2006 | Stiles et al. ................. 370/498 |
| 6,990,395 B2 | 1/2006 | Ransom et al. |
| 7,006,934 B2 | 2/2006 | Jonker et al. |
| 7,010,438 B2 | 3/2006 | Hancock et al. |
| 7,072,779 B2 | 7/2006 | Hancock et al. |
| 7,085,824 B2 | 8/2006 | Forth et al. |
| 7,089,089 B2 | 8/2006 | Cumming et al. |
| 7,127,328 B2 | 10/2006 | Ransom |
| D532,747 S | 11/2006 | Ricci et al. |
| 7,136,384 B1 * | 11/2006 | Wang ....................... 370/395.1 |
| D534,120 S | 12/2006 | Ricci et al. |
| 7,155,350 B2 | 12/2006 | Kagan |
| 7,158,050 B2 | 1/2007 | Lightbody et al. |
| 7,174,258 B2 | 2/2007 | Hart |
| 7,174,261 B2 | 2/2007 | Gunn et al. |
| 7,256,709 B2 | 8/2007 | Kagan |
| 7,262,709 B2 * | 8/2007 | Borleske et al. ......... 340/870.02 |
| 7,294,997 B2 | 11/2007 | Kagan |
| 7,304,586 B2 | 12/2007 | Wang et al. |
| 2002/0114326 A1 * | 8/2002 | Mahalingaiah ............... 370/389 |
| 2002/0162014 A1 | 10/2002 | Przydatek et al. |
| 2002/0165677 A1 | 11/2002 | Lightbody et al. |
| 2002/0169570 A1 * | 11/2002 | Spanier et al. ................. 702/61 |
| 2002/0191640 A1 * | 12/2002 | Haymes et al. ............. 370/466 |
| 2003/0014200 A1 | 1/2003 | Jonker et al. |
| 2003/0065459 A1 | 4/2003 | Huber et al. |
| 2003/0076242 A1 * | 4/2003 | Burns et al. ............. 340/870.02 |
| 2003/0101008 A1 | 5/2003 | Hart |
| 2003/0105608 A1 | 6/2003 | Hart |
| 2003/0132742 A1 | 7/2003 | Harding et al. |
| 2003/0147420 A1 * | 8/2003 | Beckwith .................... 370/466 |
| 2003/0154471 A1 | 8/2003 | Teachman et al. |
| 2003/0210699 A1 * | 11/2003 | Holt et al. ................... 370/400 |
| 2003/0212512 A1 | 11/2003 | Hart |
| 2003/0220752 A1 | 11/2003 | Hart |
| 2004/0037313 A1 * | 2/2004 | Gulati et al. ................. 370/465 |
| 2004/0066311 A1 | 4/2004 | Giles et al. |
| 2004/0138786 A1 | 7/2004 | Blackett et al. |
| 2004/0138787 A1 | 7/2004 | Ransom et al. |
| 2004/0138835 A1 | 7/2004 | Ransom et al. |
| 2004/0172207 A1 | 9/2004 | Hancock et al. |
| 2004/0183522 A1 | 9/2004 | Gunn et al. |
| 2004/0229578 A1 | 11/2004 | Lightbody et al. |
| 2005/0002417 A1 * | 1/2005 | Kelly et al. ................. 370/466 |
| 2005/0017874 A1 | 1/2005 | Lightbody et al. |
| 2005/0027464 A1 | 2/2005 | Jonker et al. |
| 2005/0071106 A1 | 3/2005 | Huber et al. |
| 2005/0256964 A1 * | 11/2005 | Dube ........................ 709/230 |
| 2005/0275397 A1 | 12/2005 | Lightbody et al. |
| 2005/0288876 A1 | 12/2005 | Doig et al. |
| 2005/0288877 A1 | 12/2005 | Doig et al. |
| 2006/0052958 A1 | 3/2006 | Hancock et al. |
| 2006/0071813 A1 | 4/2006 | Kagan |
| 2006/0077999 A1 | 4/2006 | Kagan et al. |
| 2006/0170409 A1 | 8/2006 | Kagan et al. |
| 2006/0187956 A1 | 8/2006 | Doviak et al. |
| 2006/0230394 A1 | 10/2006 | Forth et al. |
| 2006/0271244 A1 | 11/2006 | Cumming et al. |

* cited by examiner

SYSTEM AND METHOD FOR SIMULTANEOUS COMMUNICATION ON MODBUS AND DNP 3.0 OVER ETHERNET FOR ELECTRONIC POWER METER

CROSS-REFERENCE TO RELATED APPLICATIONS

The present application is a continuation-in-part application of U.S. application Ser. No. 10/969,592 filed on Oct. 20, 2004 by Kagan et al. entitled "SYSTEM AND METHOD FOR PROVIDING COMMUNICATION BETWEEN INTELLIGENT ELECTRONIC DEVICES VIA AN OPEN CHANNEL", the entire contents of which are hereby incorporated by reference. In addition, the present application claims priority to a U.S. provisional patent application filed on Oct. 12, 2004 and assigned Application Ser. No. 60/617,689, the contents of which are incorporated herein by reference.

BACKGROUND

1. Field of the Disclosure

The present disclosure relates generally to monitoring and control of metering systems. More particularly, the present disclosure relates to systems and methods for simultaneous communications on Modbus and DNP 3.0 over Ethernet for an electronic power meter.

2. Description of the Related Art

The metering architecture that exists in the power utility field today is geared toward providing enough information to accurately monitor and control a variety of metering devices installed at numerous substations. To achieve these objectives, it is essential that communication between a central utility station and substations be time- and cost-efficient, quick updating, as well as reliable.

Historically, meters measuring electrical energy have used measurement devices, which mechanically monitor the subscriber's usage and display a reading of the usage at the meter itself. Consequently, the reading of these meters has required that human meter readers physically go to the site of the meter and manually document the readings. Clearly, this approach relies very heavily on human intervention and, thus, is very costly, time-consuming, and prone to human error. As the number of meters in a typical utility's service region has increased, in some cases into the millions, human meter reading has become prohibitive in terms of time and money.

Over time, these conventional meters were made using microprocessor technologies, which enabled them to be read using a serial protocol and interface. This enabled the meters to be used in series to obtain readings back at a remote terminal unit (RTU) for remote SCADA (Supervisory Control and Data Acquisition) interrogation. For example, FIG. 1 is a schematic view of a conventional system for monitoring and controlling a plurality of substations. That is, referring to FIG. 1, meters 1, 2, and 3 can communicate serially through each other. However, in order for a SCADA master 5 to receive information from meter 3, the information must be passed from meter 3 to meter 2, from meter 2 to meter 1, from meter 1 to an RTU 4, and from the RTU 4 to the SCADA master 5.

Realization of such communication may be accomplished by a standard open protocol known as DNP 3.0. This protocol is configured to provide the power utility with a serial language to speak to the substations and to allow the utility to use outage detection software, generically labeled in the industry as SCADA. In other words, communication between each of the meters and, for example, a central station is realized through a respective serial port and is thus limited to a respective pair coupled to one another via a dedicated channel. DNP 3.0 is optimized for a round-robin type disturbance awareness response.

Furthermore, utility companies communicate to metering and data telemetry devices in substations using different serial based protocols. Different departments within a given utility company have standardized on different protocols which are optimized for the applications they have. For instance, while SCADA systems operate at peak performance using the DNP 3.0 protocol, this protocol is inefficient and difficult to manage when applied to metering departments, system planning, and estimation and power plant DCS systems. As products became more sophisticated, these differing departments wanted to obtain data from one instrument that gave them all the needed disturbance and recorded data. To date, these various departments have had to install separate equipment in substations, separate serial channels, and a variety of protocols to access the data of the monitoring instrument. This is often a costly endeavor, thus a need exists for a system for simultaneously communicating in a plurality of protocols between a monitoring instrument and the various departments in a central utility station. Furthermore, there has been a desire in the industry to eliminate serial protocols and channels and have the various data transmitted over LANs (local area networks) using dedicated T1 or frame relay networks.

SUMMARY

The above and other aspects are attained by a metering apparatus and system for monitoring and controlling a plurality of metering devices in the field of energy use/control.

In accordance with one aspect of the disclosure, a system is provided for simultaneous communications between a host device and a plurality of applications using multiple industry standard communications protocols. The system includes a means for receiving a data packet over an Ethernet connection via an Ethernet card. The data packet is transmitted using a first protocol. This transmission is accomplished by enclosing the data packet with an Ethernet protocol wrapper. A means for removing the Ethernet protocol wrapper is also included, along with a means for determining a secondary protocol used by the data packet. Additionally, the disclosed system has a means for routing the data packet according to predetermined paths selected based on the secondary protocol and a means for providing a response packet using the secondary protocol of the data packet. Further, the system utilizes a means for appending an Ethernet protocol wrapper to the response packet and a means for transmitting the response packet over the Ethernet connection.

In accordance with another aspect of the disclosure, a method for providing simultaneous communications between a host device and a plurality of applications using multiple industry standard communications protocols is provided. The method begins with receiving a data packet over an Ethernet connection via an Ethernet card, the data packet having an Ethernet protocol wrapper. The Ethernet protocol wrapper is removed. A secondary protocol, used by the data packet, is determined. The data packet is then routed according to predetermined paths selected based on the secondary protocol. Upon completing its predetermined path, a response packet using the secondary protocol of the data packet is provided. An Ethernet protocol wrapper is appended to the response packet, and the response packet is finally transmitted over the Ethernet connection.

In accordance with yet another aspect of the disclosure, a metering device is configured with an IED COM processor, operative to perform multiple tasks, and an IED Network Adapter or card built in the metering device and coupled to the processor. The card is configured to format and send data from the processor using DNP 3.0 protocol via an open socket into Ethernet TCP/IP.

According to a further aspect of the disclosure, a plurality of substations, each of which is provided with at least one metering device of the disclosure, are coupled together in a system capable of transmitting the data from each substation to either the RTU and further to the SCADA master or directly to the latter without using a dedicated serial cable or channel.

Still a further aspect of the disclosure is concerned with a system configured to provide communication between a local area network including a plurality of the metering devices of the disclosure and the Internet.

BRIEF DESCRIPTION OF THE DRAWINGS

These and other features, aspects, and advantages of the present invention will become better understood with regard to the following description, appended claims, and accompanying drawings wherein:

DESCRIPTION OF THE PREFERRED EMBODIMENTS

Figure 1:
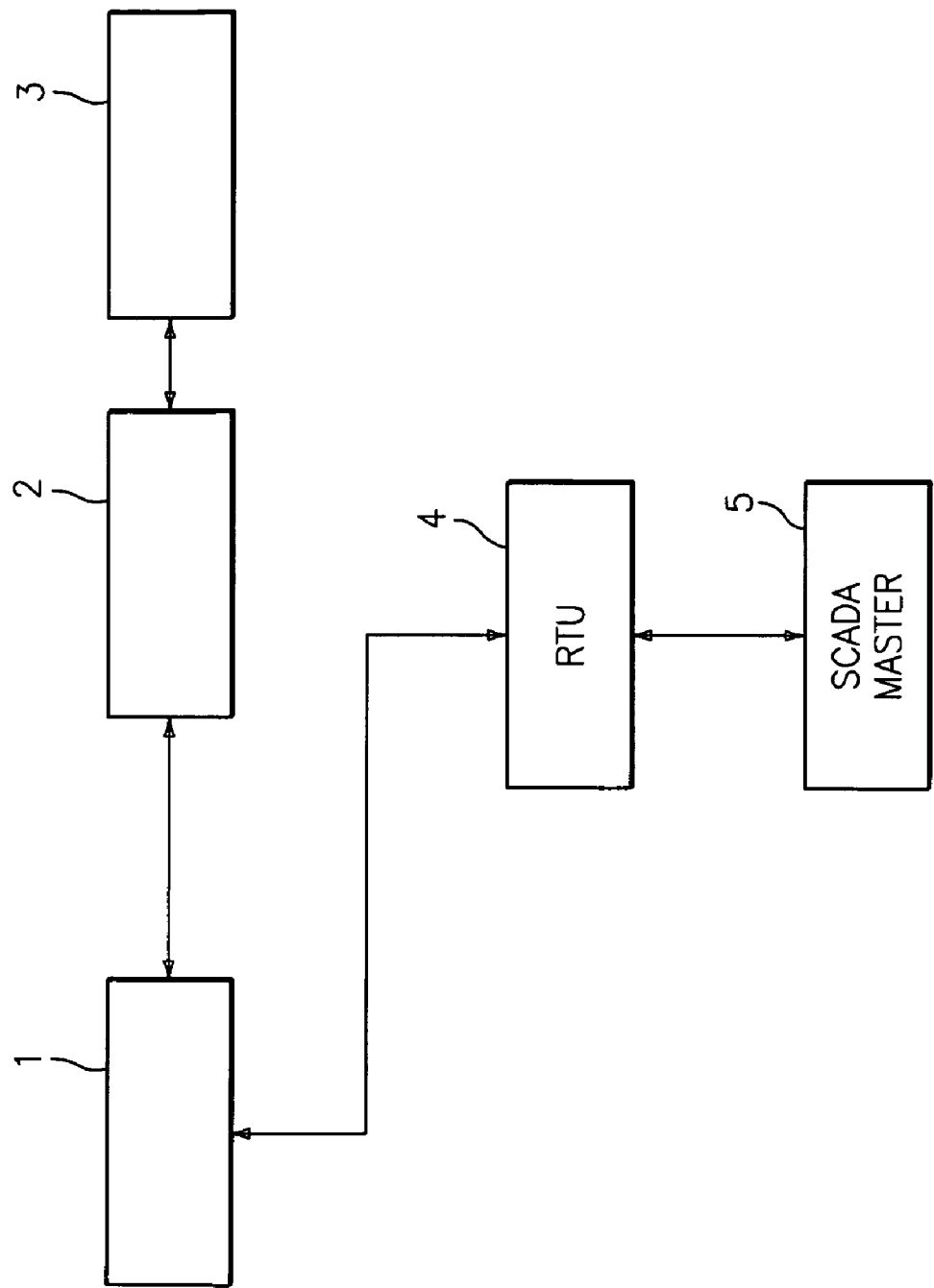
FIG. 1 is a schematic view of a conventional system for monitoring and controlling a plurality of substations.
Figure 2:
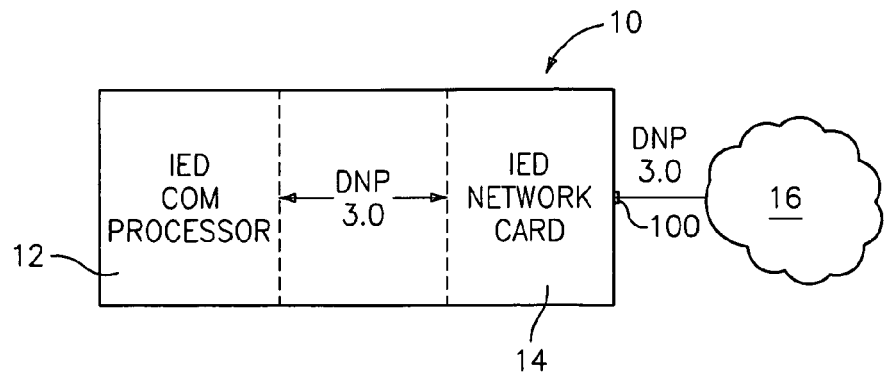
FIG. 2 is a schematic view of a metering device configured in accordance with the disclosure.
Figure 3:
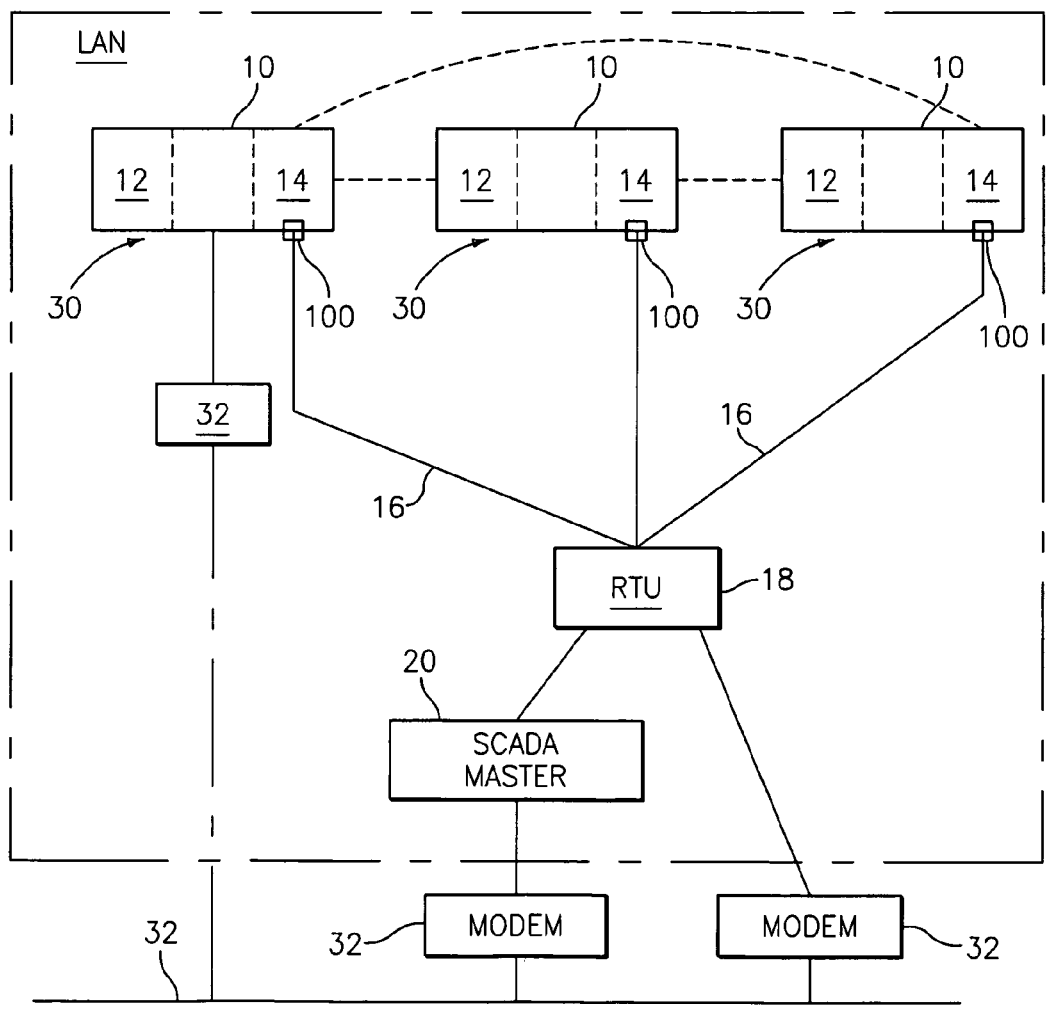
FIG. 3 is a schematic view of a system for monitoring and controlling a plurality of substations each provided with at least one metering device of FIG. 2.

Referring to FIGS. 2 and 3, a metering device 10 is configured as an intelligent electronic metering device (IEMD). Functions of the IEMD 10 may include voltage transformation, regulation and control, power-factor (e.g., capacitor-bank) and load balancing, monitoring, protection of hardware, etc.

The IEMD 10 includes an IED COM processor 12 (FIG. 2) and a built-in IED Network Card 14 coupled to the processor 12 and operative to receive and transmit data between the IEMD 10 and a remote unit through an open socket 100 within an Ethernet TCP/IP medium 16 (FIGS. 2 and 3). Unlike a conventional IEMD communicating with a remote terminal unit (RTU) or SCADA master via a dedicated channel, the card 14 adapts a serial message from or to the processor 12 using the DNP 3.0 so as to receive and transmit the message via the Ethernet medium 16.

As illustrated in FIG. 2, the card 14 strips a message from the open socket 100 channel within the Ethernet and sends it through a serial message or command to processor 12 in accordance with the prescribed DNP 3.0 protocol. In return, the processor 12 generates a serial response, including for example, a measurement requested by the SCADA, and adapted by the card 14 for sending this response via the Ethernet medium.

More specifically, the card 14 recognizes DNP by identifying an Internet Protocol (TCP, UDP, etc.). After retrieving the DNP data, the card 14 sends this data to the processor 12 over a serial channel. For this serial communication, the card 14 and the processor 12 use a predetermined protocol for faster data transfer. The predetermined protocol is only used internally between the card 14 and the processor 12. Accordingly, this protocol has its own headers and footers.

In the protocol, the DNP response is transferred to the card 14 through the serial message. When the card 14 receives this message, the DNP response is prepared with TCP/IP Header for Ethernet medium. A flow diagram illustrating this procedure is illustrated in FIG. 4.

Figure 4:
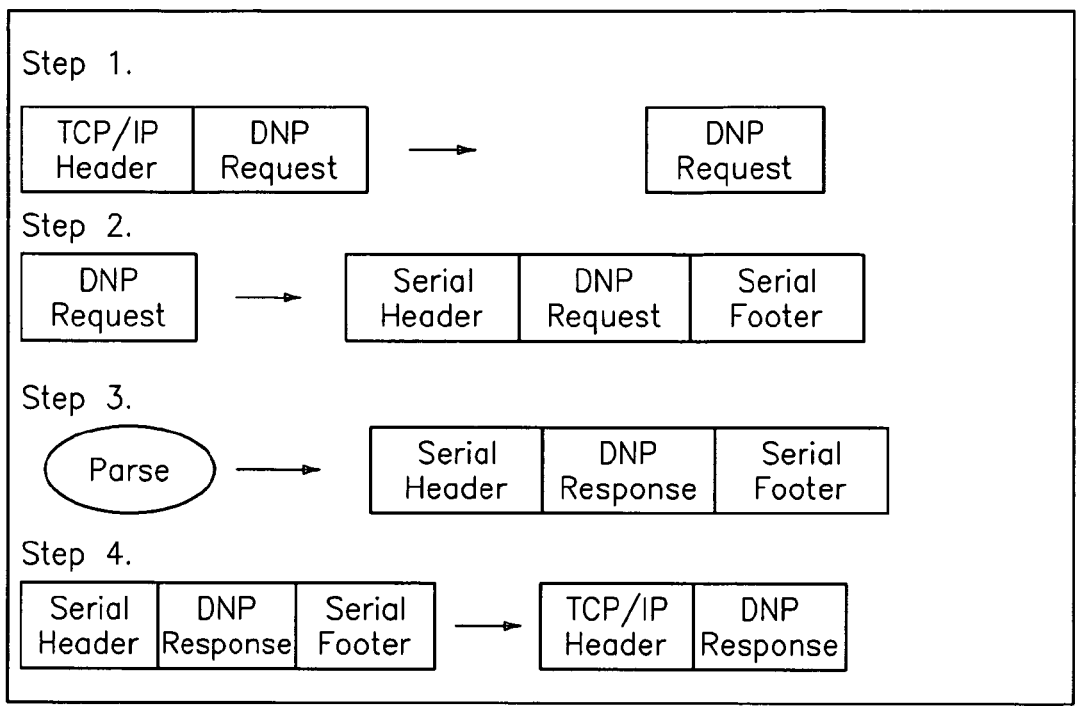
FIG. 4 is a flow diagram illustrating a method of using DNP according to an embodiment of the present disclosure.

Referring to FIG. 4, in Step 1 the card 14 recognizes the data by TCP/IP Header and Footer from the Network and strips the Header and Footer. In Step 2, the card 14 builds another Header and Footer for serial communication and transmits DNP Request to the processor 12 of the unit. In step 3, the processor 12 parses the DNP Request and a DNP response is generated. This DNP response is sent out to the card 14. Thereafter, in Step 4, the card 14 receives this DNP Response and builds TCP/IP Header and Footer. This DNP Response is sent out to the Network.

Accordingly, utilizing the inventive IEMD device, which is provided with the card 14, allows the generated data to be transmitted over the LAN to either the RTU 18 (FIG. 3) or to the SCADA master 20 itself, not through a dedicated serial cable, but through the open socket 100 within the Ethernet TCP/IP medium.

Accordingly, the inventive device 10 provides significantly higher speed outputs and eliminates the need for dedicated serial channels or dedicated wiring. Further, using the TCP/IP technology enables the metering devices to communicate, and also enables them to simultaneously communicate through more than one channel. As a result, readings can be brought back to the SCADA while other software packages can be used to interrogate the metering devices for other purposes, e.g., remote fault interrogation.

In accordance with a further embodiment of the disclosure, the inventive device 10 enables the power Utility to transmit the data via the Internet. As illustrated in FIG. 3, each device 10, defining a respective substation 30, may be directly connected to the Internet medium 32 by a coupler including a cable modem or DSL 32 (FIG. 3). Alternatively or in addition, multiple stations each including the inventive device 10 may be connected to the RTU 18 via the Ethernet medium 16 and to the SCADA master 20 via the Internet medium 32. This provides faster, more reliable communication at a much lower cost since dedicated telephone lines, radio, or other similar infrastructure does not need to be in place. Additionally, the present disclosure provides much more connectivity between devices, enables simultaneous updates from the entire system, and provides increased efficiency as no serial daisy chains are used.

Figure 5:
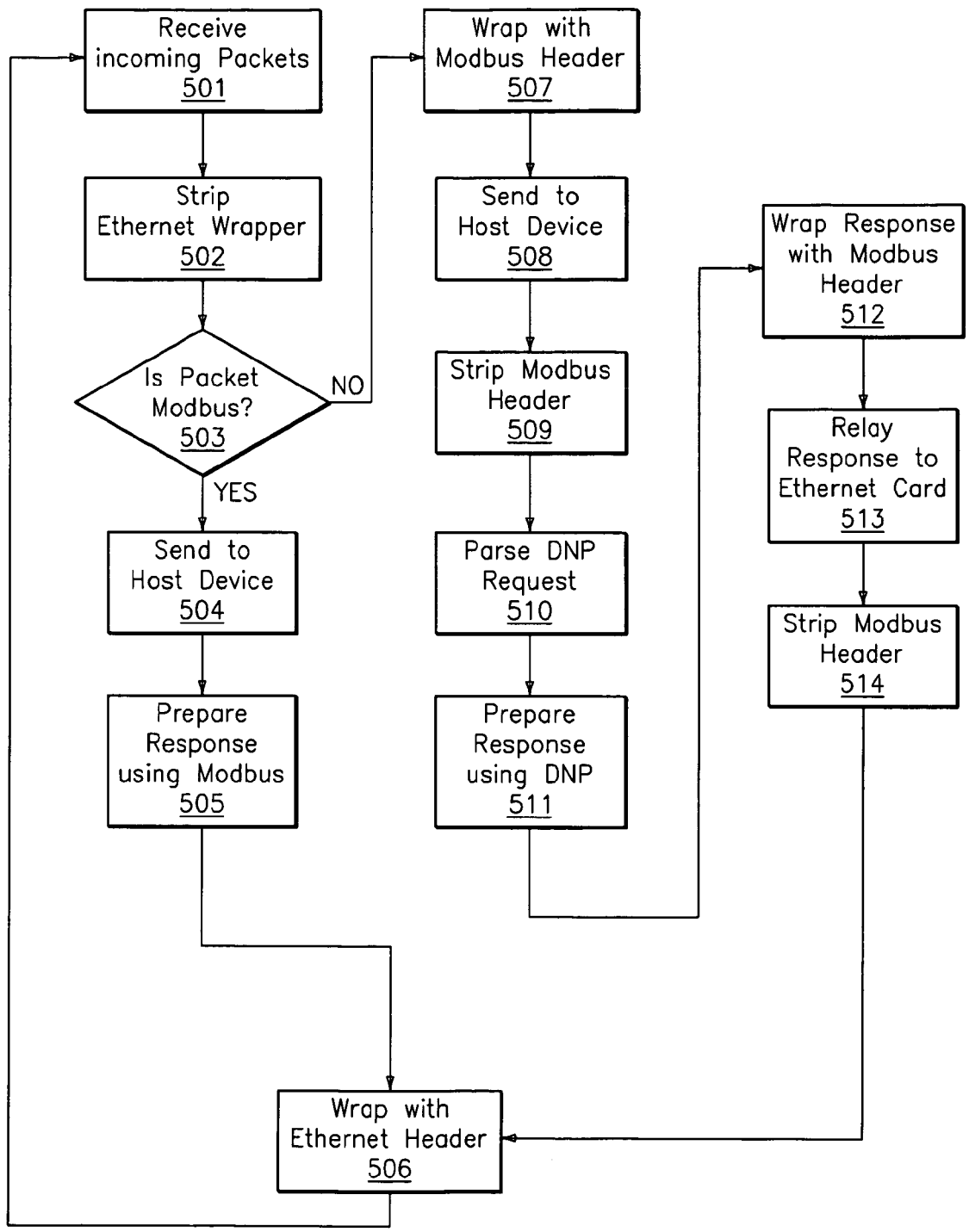
FIG. 5 is a flow diagram illustrating a method of using an Ethernet wrapper with multiple utility industry protocols according to an embodiment of the present disclosure.

As shown in FIG. 5, an alternative embodiment of the present disclosure provides a method for interoperable communications between a power meter and a plurality of applications using several industry standard communications protocols.

The method of the present embodiment begins with step 501 wherein a data packet is received by an Ethernet card 14 (FIG. 2) installed in a power meter, e.g., IEMD 10. The Ethernet card 14 strips the Ethernet protocol wrapper from the data packet in step 502. Proceeding to step 503, the packet is inspected to determine, which secondary communications protocol is being used, e.g., Modbus, DNP, etc.

If the data packet is using the Modbus protocol, the method proceeds to step 504, wherein the data packet is sent to the host device, in this case the power meter 10. In the power meter 10, the data packet is parsed and a response is prepared using the Modbus protocol, in step 505. The response packet is forwarded to the Ethernet card 14, an Ethernet wrapper is appended, and the wrapped response packet is transmitted over a connected Ethernet network 16 in step 506. The method then loops back to step 501 to await receipt of the next data packet.

Alternatively, if the data packet is determined to be using DNP (Distributed Network Protocol) in step 503, the Ethernet card 14 strips the Ethernet wrapper and a Modbus wrapper is appended to the DNP data packet in step 507. Subsequently, in step 508, the Modbus wrapped data packet is transferred to the power meter. In step 509, the Modbus wrapper is removed. The remaining DNP packet is parsed in step 510 and a response is prepared using DNP in step 511. A Modbus wrapper is appended to the response packet, in step 512, and the wrapped response packet is then relayed to the Ethernet card in step 513. In step 514, the Modbus wrapper is removed from the response packet. The method then proceeds to step 506 and continues as described above.

The present embodiment allows interoperability with multiple software systems using different communication protocols simultaneously. Having the host device and Ethernet card communicate via a serial channel allows both DNP and Modbus packets to be transferred to the host without corruption or conflict. Arbitration and high-speed protocol switching, which could negatively affect performance, is not required. Using the methods and systems of the disclosure, connections to 12 systems using different protocols can be maintained simultaneously over an Ethernet connection.

The described embodiments of the present disclosure are intended to be illustrative rather than restrictive, and are not intended to represent every embodiment of the present disclosure. Various modifications and variations can be made without departing from the spirit or scope of the disclosure as set forth in the following claims both literally and in equivalents recognized in law.

What is claimed is:

1. A method for providing simultaneous communications between an electronic power meter and a plurality of applications, the electronic power meter including a processor, an Ethernet card and a serial channel coupling the processor to the Ethernet card according to a first protocol, said method comprising the steps of:
   receiving a data packet over an Ethernet connection via the Ethernet card, said data packet using an Ethernet protocol wrapper;
   removing said Ethernet protocol wrapper;
   determining a secondary protocol used by said data packet by inspecting said data packet after said Ethernet protocol wrapper is removed;
   routing said data packet to the processor based on said step of determining said secondary protocol including routing if the determined secondary protocol matches the first protocol;
   if during said step of determining the secondary protocol does not match the first protocol, appending a wrapper according to the first protocol to said data packet and routing the data packet to the processor after the wrapper is appended to the data packet;
   parsing said data packet;
   providing a response packet including electrical energy metering information of said electronic power meter using said first protocol wherein the providing is performed by the processor in the electronic power meter and routing said response packet from the processor in the electronic power meter to the Ethernet card in the electronic power meter;
   appending an Ethernet protocol wrapper to said response packet; and
   transmitting said response packet over said Ethernet connection.

2. The method of claim 1, wherein said first protocol is a Modbus protocol.

3. The method of claim 2, wherein said secondary protocol is a DNP (Distributed Network Protocol) protocol and said data packet is a DNP data packet.

4. The method of claim 3, said routing step further comprising the steps of:
   appending a Modbus wrapper to said DNP data packet;
   transferring said Modbus wrapped DNP data packet to said processor;
   removing said Modbus wrapper from said DNP data packet; and
   parsing said DNP data packet.

5. The method of claim 4, further comprising the steps of:
   appending a Modbus wrapper to said response packet;
   transferring said Modbus wrapped response packet to said Ethernet card; and
   removing said Modbus wrapper from said response packet prior to the Ethernet protocol wrapper appending step.

6. A system for providing simultaneous communications between an electronic power meter and a plurality of applications, said system comprising:
   the plurality of applications each being supported by at least one computing device; and
   the electronic power meter operating under a first protocol comprising:
   means for receiving a data packet over an Ethernet connection via an Ethernet card, said data packet using an Ethernet protocol wrapper;
   means for removing said Ethernet protocol wrapper;
   means for determining a secondary protocol used by said data packet by inspecting said data packet after said Ethernet protocol wrapper is removed;
   means for routing said data packet to the electronic power meter based on said determining said secondary protocol including means for routing if the determined secondary protocol matches the first protocol;
   means for appending a wrapper according to the first protocol to said data packet based on said determining said secondary protocol including means for appending said wrapper according to the first protocol if the secondary protocol does not match the first protocol and means for routing the data packet to the electronic power meter after the wrapper is appended to the data packet;
   means for parsing said data packet;
   means for providing a response packet including electrical energy metering information of said electronic power meter using said first protocol from the electronic power meter to the Ethernet card;
   means for appending an Ethernet protocol wrapper to said response packet; and
   means for transmitting said response packet over said Ethernet connection.

7. The system of claim 6, wherein said first protocol is a Modbus protocol.

8. The system of claim 7, wherein said secondary protocol is a DNP (Distributed Network Protocol) protocol and said data packet is a DNP data packet.

9. The system of claim 8, the electronic power meter further comprising;
   means for appending a Modbus wrapper to said DNP data packet;
   means for transferring said Modbus wrapped DNP data packet to a processor of the electronic power meter;
   means for removing said Modbus wrapper from said DNP data packet; and
   means for parsing said DNP data packet.

10. The system of claim 9, further comprising:
    means for appending a Modbus wrapper to said response packet;
    means for transferring said Modbus wrapped response packet to said Ethernet card; and
    means for removing said Modbus wrapper from said response packet prior to the Ethernet protocol wrapper appending.

* * * * *